US008645617B2

(12) United States Patent
Shaeffer et al.

(10) Patent No.: US 8,645,617 B2
(45) Date of Patent: Feb. 4, 2014

(54) MEMORY DEVICE FOR CONCURRENT AND PIPELINED MEMORY OPERATIONS

(75) Inventors: Ian Shaeffer, Los Gatos, CA (US); Brent Steven Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 272 days.

(21) Appl. No.: 13/126,726

(22) PCT Filed: Oct. 15, 2009

(86) PCT No.: PCT/US2009/060911
§ 371 (c)(1),
(2), (4) Date: Apr. 28, 2011

(87) PCT Pub. No.: WO2010/077414
PCT Pub. Date: Jul. 8, 2010

(65) Prior Publication Data
US 2011/0208905 A1 Aug. 25, 2011

Related U.S. Application Data

(60) Provisional application No. 61/121,083, filed on Dec. 9, 2008.

(51) Int. Cl.
*G06F 12/00* (2006.01)
(52) U.S. Cl.
USPC .......................................... 711/103; 711/154
(58) Field of Classification Search
USPC .................. 711/168, 169, 103, 154
See application file for complete search history.

(56) References Cited

U.S. PATENT DOCUMENTS

| 3,562,554 | A | * | 2/1971 | Von Feldt | 327/51 |
| 4,713,797 | A | * | 12/1987 | Morton et al. | 365/185.21 |
| 5,282,271 | A | * | 1/1994 | Hsieh et al. | 326/38 |
| 5,371,708 | A | * | 12/1994 | Kobayashi | 365/221 |
| 5,465,235 | A | * | 11/1995 | Miyamoto | 365/185.25 |
| 5,519,847 | A | * | 5/1996 | Fandrich et al. | 711/169 |
| 5,570,040 | A | * | 10/1996 | Lytle et al. | 326/41 |
| 5,717,871 | A | * | 2/1998 | Hsieh et al. | 710/317 |
| 5,982,700 | A | * | 11/1999 | Proebsting | 365/230.05 |

(Continued)

OTHER PUBLICATIONS

IEEE 1005-1998, IEEE standard, Standard Definitions and Characterization of Floating Gate Semiconductor Arrays, 1998 document made of record but not relied upon. Attached as file IEEE_1005-1998.pdf.*

(Continued)

*Primary Examiner* — Matthew Bradley

(57) ABSTRACT

This disclosure provides a non-volatile memory device that concurrently processes multiple page reads, erases or writes involving the same memory space. The device relies upon a crossbar and a set of page buffers that may each be dynamically assigned to each read or write request. The device also separates memory array control from IO control, such that multiple cycle state change operations can be performed while the buffers are used to transfer data into and out of the buffers along an external data bus; using this structure, the memory device can accept multiple transactions where pages can be immediately loaded into buffers and then "pipelined" either for transfer to a write data register or to an external bus as appropriate. By significantly mitigating the substantial "busy time" associated with program and erase of non-volatile memory devices, especially flash devices, this disclosure greatly expands potential application of such devices.

43 Claims, 4 Drawing Sheets

(56) References Cited

U.S. PATENT DOCUMENTS

| | | | | |
|---|---|---|---|---|
| 6,240,040 | B1* | 5/2001 | Akaogi et al. | 365/230.06 |
| 6,356,975 | B1* | 3/2002 | Barth et al. | 711/105 |
| 6,370,619 | B1* | 4/2002 | Ho et al. | 711/129 |
| 6,377,502 | B1* | 4/2002 | Honda et al. | 365/230.03 |
| 6,470,423 | B1* | 10/2002 | Ho et al. | 711/129 |
| 6,483,748 | B2* | 11/2002 | Futatsuya et al. | 365/185.11 |
| 6,728,161 | B1* | 4/2004 | Roohparvar | 365/233.1 |
| 6,851,026 | B1* | 2/2005 | Roohparvar | 711/150 |
| 6,882,562 | B2* | 4/2005 | Beucler | 365/154 |
| 6,889,304 | B2* | 5/2005 | Perego et al. | 711/170 |
| 7,031,192 | B1* | 4/2006 | Park et al. | 365/185.22 |
| 7,071,731 | B1* | 7/2006 | Choe et al. | 326/40 |
| 7,142,477 | B1* | 11/2006 | Tran et al. | 365/230.02 |
| 7,190,615 | B2* | 3/2007 | Fujito et al. | 365/185.05 |
| 7,280,398 | B1* | 10/2007 | Lee | 365/185.11 |
| 7,404,033 | B2* | 7/2008 | Li et al. | 711/107 |
| 2002/0024884 | A1* | 2/2002 | Roohparvar | 365/238.5 |
| 2002/0031007 | A1* | 3/2002 | Osada et al. | 365/156 |
| 2002/0048272 | A1* | 4/2002 | Carvey | 370/400 |
| 2002/0065985 | A1* | 5/2002 | Garnett et al. | 711/117 |
| 2003/0076719 | A1* | 4/2003 | Byeon et al. | 365/200 |
| 2003/0086295 | A1* | 5/2003 | Honda et al. | 365/185.13 |
| 2003/0117860 | A1* | 6/2003 | Roohparvar | 365/189.12 |
| 2003/0117877 | A1* | 6/2003 | Roohparvar | 365/230.03 |
| 2003/0221048 | A1* | 11/2003 | Roohparvar | 711/103 |
| 2004/0160829 | A1* | 8/2004 | Tsujikawa et al. | 365/185.28 |
| 2004/0165473 | A1* | 8/2004 | Roohparvar | 365/233 |
| 2004/0168016 | A1* | 8/2004 | Roohparvar | 711/103 |
| 2004/0172499 | A1* | 9/2004 | Roohparvar | 711/103 |
| 2004/0202020 | A1* | 10/2004 | Fujito et al. | 365/185.2 |
| 2004/0218437 | A1* | 11/2004 | Honda et al. | 365/200 |
| 2005/0073894 | A1* | 4/2005 | Roohparvar | 365/210 |
| 2005/0141298 | A1* | 6/2005 | Lee et al. | 365/200 |
| 2005/0169081 | A1* | 8/2005 | Honda | 365/210 |
| 2005/0219007 | A1* | 10/2005 | Tsai et al. | 333/26 |
| 2005/0219907 | A1* | 10/2005 | Roohparvar | 365/185.22 |
| 2005/0251617 | A1* | 11/2005 | Sinclair et al. | 711/103 |
| 2006/0176742 | A1* | 8/2006 | Yamada | 365/189.05 |
| 2006/0221704 | A1* | 10/2006 | Li et al. | 365/185.28 |
| 2006/0256616 | A1* | 11/2006 | Honda et al. | 365/185.11 |
| 2007/0109867 | A1* | 5/2007 | Li et al. | 365/185.22 |
| 2007/0143571 | A1* | 6/2007 | Sinclair et al. | 711/203 |
| 2007/0195582 | A1* | 8/2007 | Sakata et al. | 365/148 |
| 2007/0211537 | A1* | 9/2007 | Park et al. | 365/185.22 |
| 2007/0294466 | A1* | 12/2007 | Gower et al. | 711/100 |
| 2007/0300011 | A1* | 12/2007 | Oshima | 711/103 |
| 2008/0098163 | A1* | 4/2008 | Lin | 711/103 |
| 2009/0310408 | A1 | 12/2009 | Lee et al. | 365/185.03 |
| 2011/0060875 | A1 | 3/2011 | Haukness et al. | 711/103 |

OTHER PUBLICATIONS

Notification of Transmittal of the International Search Report and the Written Opinion of the International Searching Authority with mail date of Sep. 3, 2009 re PCT/US2009/042952 filed on May 6, 2009. 15 pages.

International Search report and the written Opinion with mail date of May 31, 2010 re Int'l Application No. PCT/US2009/060911. 15 Pages.

* cited by examiner

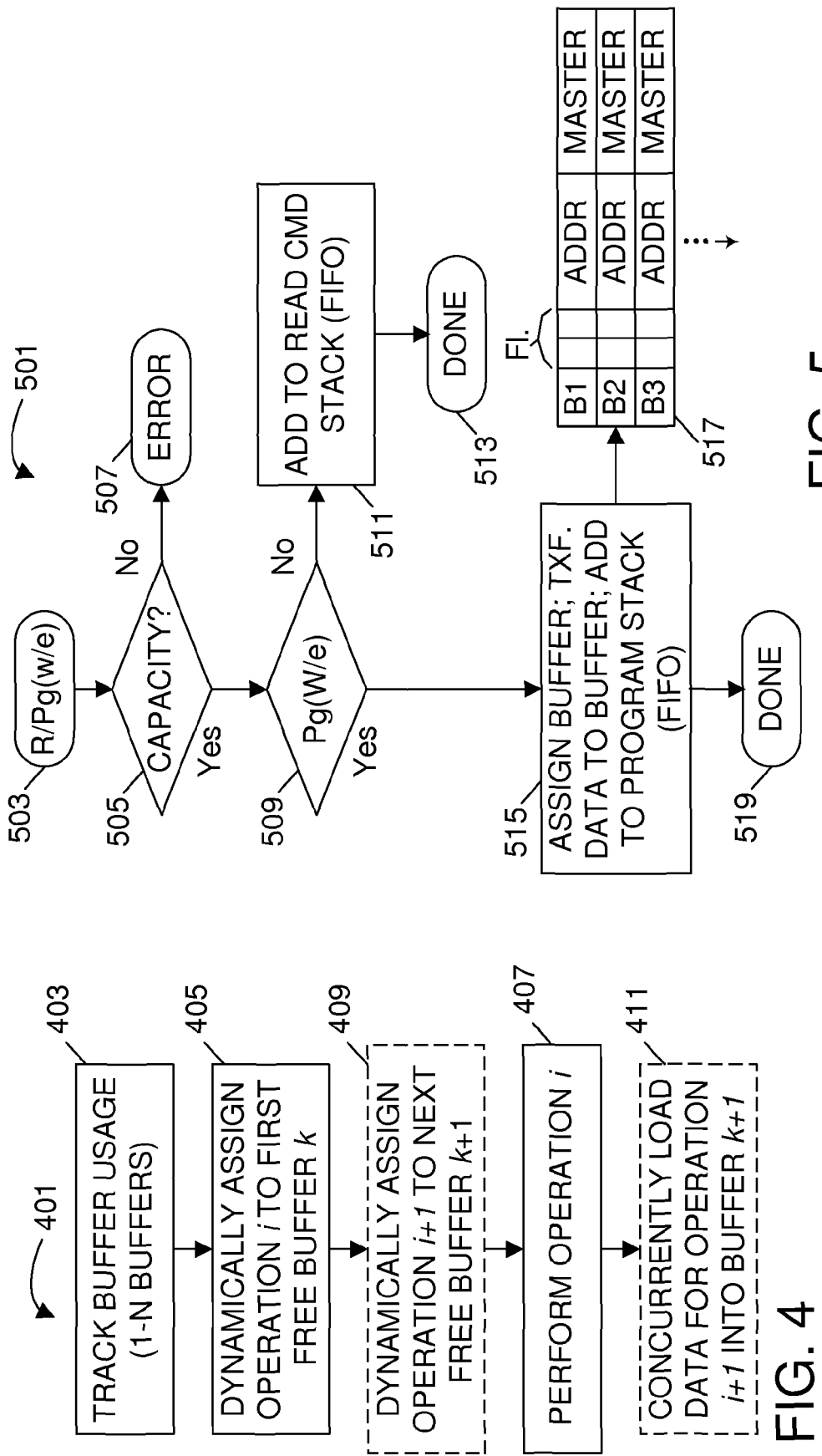

MEMORY DEVICE FOR CONCURRENT AND PIPELINED MEMORY OPERATIONS

This application claims priority to U.S. Provisional Application No. 61/121,083 for "Non-Volatile Memory Device for Concurrent And Pipelined Memory Operations," filed on 9 Dec. 2008 on behalf of inventors Ian Shaeffer and Brent Steven Haukness; this prior application is hereby incorporated by reference as though identically set forth herein.

BACKGROUND

Certain types of non-volatile memory devices are designed so that portions of memory space must be written or erased together as a single storage unit, typically as a "page" or "block;" owing to variability in each memory cell within these designs, operations that change the cell data state (e.g. program or erase) in turn are often based on iterative cycles. These iterative cycles are called "program-verify" cycles and, despite use of "program" within this term, it should be understood that the term refers to the same basic operation whether writing or erasing of a block is performed. In each cycle, the memory device or a controller (i) attempts to change the state of the storage unit using a specific voltage, and (ii) checks to see which cells have not changed state correctly; cycles are then repeated as necessary for those cells which have not yet correctly changed state using a slightly higher voltage each iteration until the cells either have the correct state or until an error is generated (the unit would then typically be marked as "bad").

An unfortunate side effect of this methodology is that the state change operations can take significant time to complete; for example, write transactions can take ten times longer than read transactions in NAND flash memory, and more than one-thousand times longer than read transactions in NOR flash memory. Attempts to address this problem have usually focused on using plural non-volatile devices, or on dividing up memory space in to what are effectively multiple banks, each with supporting circuitry allowing each bank or device to be independently read. Generally speaking, however, most structures still do not support concurrent processing upon the same basic "bank" served by a single sense array and supporting write circuitry, i.e., subsequent read, erase, write or other transactions must typically be queued until all iterative cycles of a prior operation have fully completed for the block or page in question.

What is needed is a way to mitigate the aforementioned problem, ideally if possible, eliminating the bottleneck entirely by permitting the initiation of read, program or erase operations notwithstanding that a prior program or erase operation is in progress. The present inventions address this need and provide further, related advantages.

BRIEF DESCRIPTION OF THE DRAWINGS

FIG. 3 indicates that the system effectively provides two crossbars, one between the buffers and a flash storage array 307 for each memory device, and one between the buffers and the flash controller. A vertical, dashed line 315 denotes that separate control logic may be used for each crossbar, such that input/output ("IO") control for the device may be managed independently of memory array control. That is to say, control logic for the IO can manage flows of data between the controller and the various buffers 313 independently of flows of data between the buffers and the flash storage array 307.

FIG. 4 is a flow diagram of a method 401 of tracking buffer usage in a multiple buffer embodiment. As indicated by dashed-line functional blocks, the method 401 provides for the execution of one memory operation while data for another memory operation is concurrently being transferred into or out of a buffer.

FIG. 5 is a flow diagram of a method 501 used by IO control logic to process newly received memory requests from a controller. As indicated by FIG. 5, the method 501 calls for managing a status register 517 that tracks the usage and status of each of a plurality of buffers; three buffers, labeled "B1," "B2," and "B3" are tracked by the register. The register permits assignment of buffers to new memory requests, but it also permits the read of data that is currently in the midst of a state change operation. By using address fields to index the buffers, the buffers may collectively be used as a data cache while the device sense array and write data register are busy. As indicated by an optional "master" field, the status register may be configured to support a multiple master implementation.

DETAILED DESCRIPTION

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application to certain methods and devices. The description set out below exemplifies (i) a non-volatile memory device that may be used to process multiple operations in parallel, (ii) a non-volatile memory device having novel routing, and (iii) control methods associated with managing such a non-volatile memory device. While these specific examples are presented, the principles described herein may also be applied to other methods and devices as well.

I. Overview

This disclosure provides several embodiments of a non-volatile memory device that variously (a) permits the performance of one memory operation while another memory operation is queued, (b) permits (within a single "bank" of memory as well as multiple banks) the generally parallel read of one storage unit while another is the subject of a state change operation (e.g., while it is being written), (c) permits generally parallel state changing of a storage unit and concurrent read of the new (i.e., write or erase data being placed into that storage unit), and (d) provides methods of controlling the memory device, in a system or otherwise, to achieve one of these functions. In particular, by mitigating the effects of a long lead-time required to program or erase a storage unit within non-volatile memory (e.g., within a flash memory device), the embodiments discussed herein provide for a significant improvement in the usability of certain non-volatile devices. That is to say, the teachings provided by this disclosure should result in increased use of non-volatile memory, especially flash memory, to a much broader range of applications, potentially extending the capabilities of those applications and enabling new applications.

Figure 1:
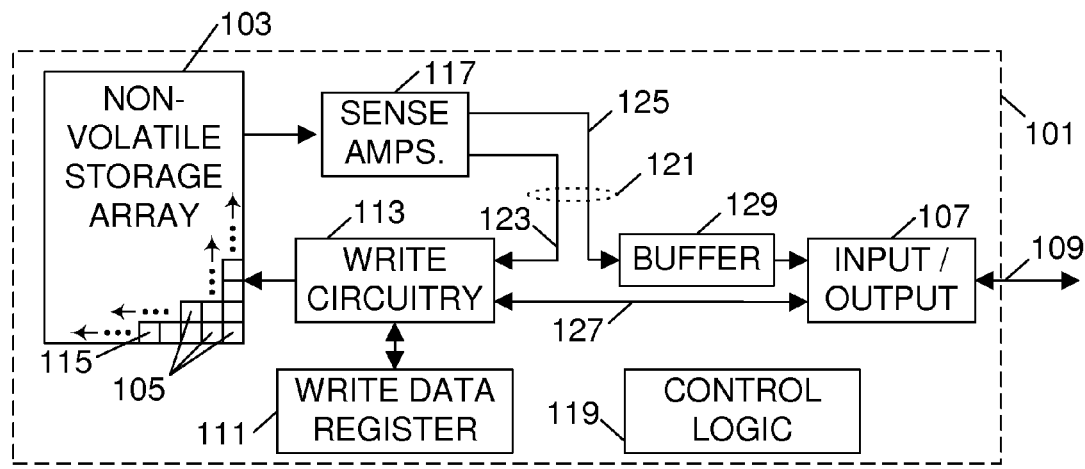
FIG. 1 is a functional diagram of a memory device that has internal routing that can support interleaved use of a sense amplifier unit 117 for both reads to a non-volatile storage array 103 and a multiple cycle state change operation that involves sense amplifier unit feedback to a write data register.

A first memory device embodiment provides a non-volatile storage device, labeled 101 in FIG. 1. This non-volatile storage device permits reads of a specific storage array 103 notwithstanding that a state change operation may be contemporaneously in progress. As is conventional, the array is divided into a number of storage units 105 that each represents the minimum grouping of memory cells that must be programmed together or erased together. [In this regard, certain conventional flash devices reflect a design philosophy of high density and very low cost, and so sacrifice access granularity in favor of cost and density; certain designs are such that their structures must be programmed in "pages" and erased in "blocks," e.g., NAND flash—In conventional flash methodology, a "page" may consist of about 4,000 bytes of data, and a "block" may consist of thousands of pages.] As used herein, the term "page" will be used to refer to a memory unit that is at least as large as the minimum structure or unit that can be programmed or erased as a single unit.

The way that state change is conventionally effected in these devices is that an input/output ("IO") interface 107 of the device receives inbound data from an external data bus 109. [In the case of an erase operation, the actual data can be internally generated and may consist of a solid block of "ones," used to verify the change of the storage unit to an erased state.] The data is fed to a write data register ("WDR") 111 and write circuitry 113 of the device 101 attempts a state change operation of a particular storage unit, such as a unit identified by numeral 115 in FIG. 1, using a minimum voltage. Because each individual memory cell (either a single level cell, i.e., "SLC," or multi-level cell, i.e., "MLC," depending on design) can have different levels of defects as an artifact of manufacturing or developed through use, each cell may require a different voltage before it can be changed to the desired logic state. Accordingly, following application of the voltage (i.e., following the "programming phase") the device 101 then performs a verify operation using a sense array (or "sense amplifier unit") 117, to compare the contents of the storage unit 115 with the contents of the write data register 111 using the write circuitry 113 (i.e., the "verify phase"). Contents which do not match trigger another iterative cycle with a higher voltage, under the auspices of device control logic 119. Each such "cycle" is repeated as necessary until all cells within the particular storage unit 115 have the correct state, up to a maximum number of cycles. When the operation is complete, the control logic 119 notifies a controller or, alternatively, asserts an error value if the maximum number of cycles is reached (which typically causes the controller to mark the storage unit as "bad"). Notably, while an erase operation differs from a program operation in the manner in which voltage is applied, the basic operational flow is effectively the same. Each data write is usually preceded by an erase operation, to effectively "reset" the memory cells (or a block encompassing such cells) for the storage unit in question. Each iterative sequence of attempting to write a value to a memory cell (or memory cell level) and then attempting to verify successful write is called a "program-verify" or "PV" cycle.

The embodiment seen in FIG. 1 permits reads of a specific storage array 103 during a state change operation using novel internal routing and what effectively is a switching mechanism, depicted by numeral 121 in FIG. 1. The routing includes three effective paths, including a first path 123 that effectively couples the write data register 111 with the sense amplifier unit 117, a second path 125 that effectively couples the IO interface 107 with the write data register 111 and a third path 127 that couples the sense amplifier unit with the IO interface; the third path is used during a data read to load data from the memory space (as sensed by the sense amplifier unit) into a buffer 129, for subsequent output to a memory controller. In the embodiment depicted in FIG. 1, concurrent writes and reads may occur because the data output from the sense amplifier unit can be rerouted during a multiple cycle state change operation between either the write data register (via the first path 123) or to the buffer (via the second path 125). This operation is also performed under the auspices of the control logic 119.

Notably, the structure and operation depicted in FIG. 1 represents a different approach to the latency problem than mere use of multiple banks. With multiple bank structures, it is possible to read one bank (or a different device) at the same time that a state change operation is in-progress in a second bank (or device), because each bank or device has its own write data register; by contrast, the embodiment presented in FIG. 1 permits the same memory storage space, served by that write data register, to be read during a multiple cycle state change operation that ties up that register. Notably, as will be discussed below, some embodiments presented by this disclosure permit simultaneous read of data in the same non-volatile storage array, but it should be understood that the embodiment of FIG. 1 is not required to have this capability.

Figure 2:
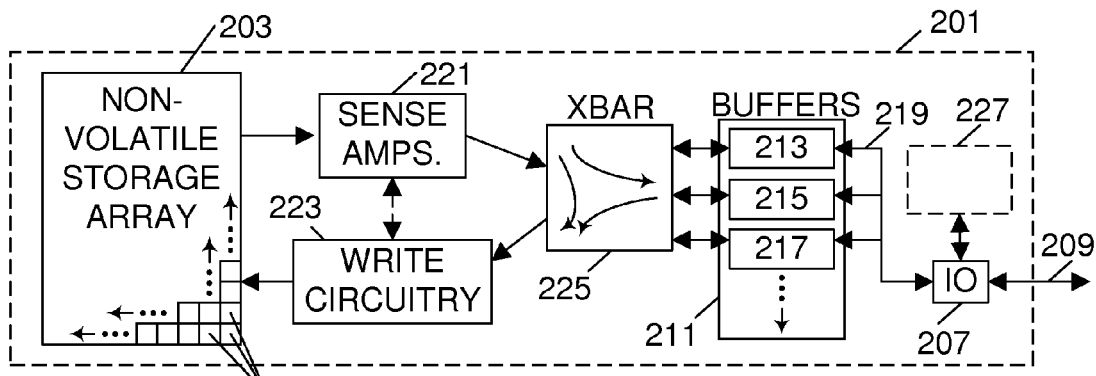
FIG. 2 is a functional diagram of a second memory device. Unlike the device seen in FIG. 1, the embodiment presented by FIG. 2 uses an array 211 of buffers (213, 215 and 217) and a crossbar 225 to (1) connect any one of the buffers to the array so that each buffer may serve as a temporary destination for read data (e.g., as a cache to later serve pages of read data to a controller) and (2) connect any one of the buffers to write circuitry 223 (e.g., so that the buffers may be used to queue upcoming erase and write transactions until an operation already in-progress within the write circuitry is completed).

FIG. 2 illustrates a second embodiment that may be configured to provide this current read capability for data that will programmed or otherwise written in to memory ("program data"). In particular, FIG. 2 shows a second memory device 201 having some similar elements to those discussed above in connection with FIG. 1. The memory device includes a non-volatile storage array 203, with the storage space being divided into a number of storage units 205, an 10 interface 207, and pins (not shown) for connecting the IO interface with an external bus 209. The memory device 201 of FIG. 2 also includes an array or set 211 of data buffers, each buffer sized to at least correspond to a storage unit size (e.g., page size, for a NAND flash memory device). This second embodiment is seen to have at least three buffers in the array, respectively numbered at 213, 215 and 217, each coupled to the IO interface via an internal bus 219. The buffers may each be used to store a page of inbound write data, such that concurrent operations may be processed in parallel. Without limiting the generality of the foregoing, the embodiment seen in FIG. 2 permits:

(a) processing of multiple read operations, e.g., one buffer (such as buffer 213) can be filled with data transferred from the sense amplifier unit 221 while another buffer (such as buffer 215) is feeding its contents to the external bus;

(b) processing of multiple state change operations, e.g., one buffer (such as buffer 215) can be filled with data from the external bus 209 while another buffer (such as buffer 213) is feeding its contents to the write circuitry 223 (and to the write data register, not separately depicted in FIG. 2);

(c) processing of a read operation and state change operation at the same general time, e.g., one buffer (such as buffer 217) can be filled with data transferred from the sense amplifier unit 221 either while another buffer (such as buffer 213) is being filled with data from the IO interface 207 or while the sense amplifier unit and write circuitry are performing a multiple cycle write or erase operation; and (d) data to be written into the storage array 203 may be stored as a copy in one of the buffers (213, 215 or 217) while the operation is ongoing (i.e., with the sense amplifier unit feeding back data to the write circuitry) such that during an operation, data may be read from the buffer array 211 instead of from the storage array 203.

Other combinations and other possible operations will also occur to one having skill in the art.

The buffer array 211 is coupled to the sense amplifier unit 221, on the one hand, and to the write circuitry 223, on the other hand, by a crossbar unit (denoted by the label "XBAR" and numeral 225 in FIG. 2). The term "crossbar," as used herein, simply refers to a form of a switching mechanism that effects two-way switching, i.e., the sense amplifier unit may be connected to any of the buffers, to route data into any one of them, and any of the buffers may be connected to either the sense amplifier unit or the write circuitry. The particular crossbar 225 depicted in the specific embodiment of FIG. 2 also performs this two-way switching in the sense that it can selectively route data (a) from the sense amplifier unit to the write circuitry, for use in multiple cycle state change operations (i.e., such that data can be fed back to modify contents of a write data register, for use as a reference in each cycle of a multiple cycle operation), and (b) from the sense amplifier unit to the buffers, for use in data reads. In the embodiment depicted in FIG. 2, this switching is provided on at least a page-wide basis, e.g., if page size if four kilobytes, then the crossbar would provide 4 kB of simultaneous switching for each point of origin in order to effect the transfers alluded to above. As mentioned for the first embodiment, discussed above, control logic may be provided (on an on-board basis if desired) in order to effect this switching within the internal routing, e.g., to control the crossbar in the embodiment of FIG. 2. As indicated by a dashed line that connects boxes 221 and 223, it is typically desired to feed data back from the sense arrays to the write circuitry for use in state change operations; this operation may be implemented by a direct connection between these two elements or, alternatively, by providing the crossbar 225 with capability to perform this routing. In this regard, the write data register (not separately identified in FIG. 2) is typically a "working buffer" that is modified with each cycle to store change data, that is, to identify which cells have not been correctly changed thus far, and to indicate state changes still needed with each cycle. It would also be possible to configure the write data register as a conventional buffer in alternate implementations.

FIG. 2 shows a dashed line box 227, which represents an optional addressing and control function to support external addressing into the memory device. In particular, while various control options will be discussed below, one possible implementation of FIG. 2 is as a memory device with multiple buffers that may be individually addressed by a controller. For example, the buffers 213, 215 and 217 (as well as any other buffer in the array) may be implemented such that an external device may write program data directly to these buffers or retrieve read data from these buffers (once a corresponding page has been relayed into the buffer array). In this regard, because it may take some finite amount of time to retrieve data from the memory array and the sense amplifier unit (e.g., in the case of a read operation), this addressing and control function may permit a controller to initiate operations and then pull read data whenever the memory device has sensed the data, loaded into a buffer, and is primed to provide the data. These capabilities and associated functionality will be further discussed below in connection with the section dealing with methods of operation.

Figure 3:
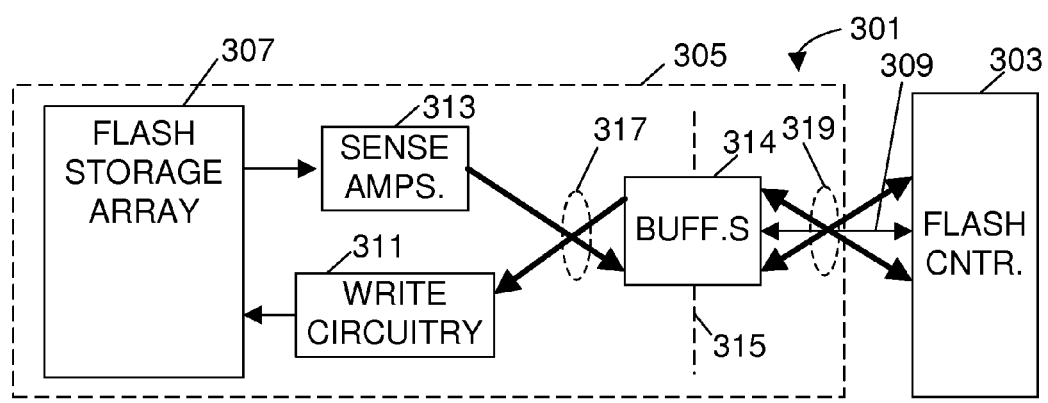
FIG. 3 is a functional diagram showing yet another memory device as part of a memory system 301, with the memory system also including a flash controller 303.

FIG. 3 represents yet another implementation of principles provided by this disclosure. In particular, FIG. 3 shows a system 301 that includes a flash controller 303 and one or more flash devices—only one exemplary flash device 305 is depicted in FIG. 3. Each flash device includes a flash storage array 307 and means for connecting to an external data bus 309, as well as write circuitry 311 (including a write data register), a sense amplifier unit 313 and buffer array 314, as was discussed above in connection with the embodiment of FIG. 2. FIG. 3 further includes, however, a vertical line 315 used to distinguish memory array control from IO control, respectively denoted by reference numerals 317 and 319. In the embodiment of FIG. 3, IO control logic governs the transfer of data between the buffer array 314 and the external bus 309, while memory array control logic governs communications between the buffer array 314 and the flash storage array. Each of the memory array control logic and IO control logic functions may fill buffers with new data and may unload (i.e., transfer) a copy of data from one of the buffers elsewhere. Depending on implementation, these buffers can be cleared (i.e., released) once data has been transferred out, or they may be caused to retain data until occurrence of a specific event (such as completion of a specific programming or state change step). In the embodiment seen in FIG. 3, two switching mechanisms (e.g., crossbars) are effectively represented, each denoted by crisscrossing heavy-set lines, to indicate that data may be sent to or retrieved from any buffer, for either the sense array or for the flash memory controller (or even multiple controllers, e.g., pursuant to certain embodiments that will be discussed below). Assignment of buffers may be dynamic (e.g., with buffers reassigned to a new operation once a prior operation is completed), with this "dynamic assignment" performed either by the memory device or under the auspices of a memory controller (such as the flash memory controller 303), as will be further discussed below.

II. Methods of Operation

Most of the embodiments presented above rely on internal routing and a switching mechanism (such as a crossbar) to effectively route data from a memory sense mechanism (e.g. a sense array unit) either to the write data register (for use in a multiple cycle state change operation, to modify data in that register and continue the operation as necessary via additional cycles) or to the external bus in connection with a read of a memory page; the structures presented above permit both of these operations within a given multiple cycle state change operation involving the memory space.

There are several methods by which this operation may be implemented, perhaps the simplest of which is to provide a remote memory controller (e.g., a flash controller) with granularity into memory device operation, down to each state change step or cycle within memory device(s) in question. For example, if the memory device is designed to execute a number of commands (using a machine language, for example), the controller can issue sequential, individual commands to: (a) move contents from a buffer into the write data register; (b) perform one or more erase cycles to reset contents of a storage unit (e.g., memory page) or group of storage units (e.g., memory block) at a specific address where an operation is to be performed; (c) copy contents from one storage unit into a buffer; (d) attempt to program or erase a memory unit (having a specific address) with contents of the write data register using a first voltage "V1;" (e) compare the storage unit contents with contents of the write data register, with atomic update of differences into the contents of the register; (f) direct a subsequent data read to any storage unit location (other than the one subject to state change, or to a buffer holding data that is being currently written into a storage unit location); or (g) direct further state change and verification/comparison iterations at higher voltages. Alternatively, it may be desired to design memory devices themselves (e.g., flash devices) to have internal structure and logic to support many of these operations. Considerations pertinent to each of these designs and their various permutations will be discussed below, together with design considerations pertinent to design of a memory device adapted to interact with several different masters (e.g., several different controllers or CPUs).

FIG. 4 presents a flowchart of a control method 401 that may be used to manage multiple, pipelined memory operations for a flash device that has several buffers, for example, as exemplified by the structures of FIGS. 2 and 3. As indicated by reference numeral 403 and an associated functional block, in a system having N buffers, the control method will generally track the usage of each buffer to determine whether the buffer is free or is in use, and to dynamically allocate unused buffers to new memory transactions. In this regard, it should be noted that some memory transactions (e.g., reads mixed with state change operations) may take different amounts of time to complete. For example, an earlier state change operation may still be ongoing, even after a later-initiated read of a memory page has been completed; in such a situation, a buffer later-assigned to the read operation may be released and available for reuse at an earlier time than a buffer used for the state change operation. Accordingly, as indicated by numeral 405, when a new transaction arrives, the first available buffer may be assigned to a new operation "i," with buffer assignment occurring on a round robin or absolute ordering basis. Importantly, as will be introduced below in connection with FIG. 5, a status register may be used for control purposes with an entry for each available buffer and flags "FI" to indicate whether the particular buffer is free, is used, or is in the process of being loaded. If the controller manages this process, the status may be stored locally to the controller, with the controller "knowing" whether one or more buffers are available; in embodiments where the memory device manages this process, the memory device may perform dynamic buffer assignment and may raise an error signal to the controller if all buffers are in use and the operation "i" cannot be queued. As indicated by reference numeral 407, when the memory device is ready, it performs the memory operation "i," be it a state change operation (such as a write or erase operation), a read, or some other transaction.

Two dashed-line function blocks 409 and 411 are illustrated in FIG. 4, to illustrate concurrent processing operations when two operations are presented at the same time. In this regard, it should be assumed for purposes of this discussion that a second memory operation "i+1" is received prior to the completion of the first memory operation "i."

Most operations will involve multiple steps or functions, with management of each of these functions being performed by either the controller or the memory device, depending on the implementation. For example, as just mentioned, the controller may itself manage this process in implementations where the memory device supports machine commands or, alternatively, control logic in the memory device may break down requests from the controller (e.g., a read command, program command, or erase command) into individual steps, and control their administration. In the case of a read operation, steps that typically need to be effectuated include charging the sense circuitry, controlling the read of a memory page and controlling the transfer of contents. Because this operation may take time to perform, the controller may need to be informed (in implementations where it does not manage each step in the process) that the page has been read and is available for upload and, accordingly, the memory device may need to signal the controller that the read data is available, such as by setting a status register that will be read by the controller, or raising a signal on a free/busy pin. Steps associated with an erase request and write request may be very similar to one another, in that multiple voltage pulses may be applied in iterations ("cycles"), with each cycle concluding with a comparison or "verify" step to determine the extent to which the cycle has successfully programmed or erased the memory cells in question. Each cycle may involve commands to charge circuitry to have a specific voltage, to gate voltage into specific circuitry (e.g., to control transistors that selectively apply voltage to column lines or to each memory cell gate), to sense cell contents, to perform an "exclusive-OR" operation, and so forth. Each program command may follow an erase of the memory storage unit that is to be the subject of the command (this is especially true for flash memory), in order to free up one or more blocks that will be used for programming. Each step associated with each operation type may be performed by sequential commands or hardware logic, and the structures and the related teachings provided by this disclosure permit the controller or device control logic to interlace multiple steps.

Thus, multiple memory operations may be effectuated simultaneously for the disclosed structures by interleaving state change and read operations.

In the case of concurrent read operations, reads of multiple pages may be pipelined, with contents for each page being stored in a separate buffer (if multiple buffers are available). For single cell-based memories, it may be desired to apply the sensing mechanism (e.g., the sense amplifier unit) to complete the sensing of one page and the associated transfer of the page into a buffer, before applying the sensing mechanism to a different page. Generally speaking, different circuitry, voltages and voltage paths may be used for read, write and erase commands, and it may be desired to close out on an iteration or cycle for each of these operations (e.g., for an entire page) before moving on to the next read.

In the case of concurrent state change operations, the write data register and its tie-in to the sensing mechanism typically provides a restriction on concurrent operations, meaning that operations are most easily interrupted between iterative cycles that collectively make up the state change operation. It is also possible to reapply the sensing mechanism in the array in between the programming and verify phases of each cycle but, typically, the same column and supporting circuitry will be used for each phase, so the most practical operation may be to interleave other operations between individual cycles that make up the state change operation. [If desired for a particular implementation, it is certainly possible to interleave other operations in between the program and verify phases of a single cycle.] While a state change operation is ongoing, it is possible to read the subject of programming, i.e., by leaving a copy of the write data, as originally transferred into the write data register, in a dynamically assigned buffer—the buffer need only be associated with the address of the memory page. This operation is desirable because, as alluded to above, for conventional programming operations, the write data register is often used as a working buffer, storing only change data between PV cycles; thus, once programming has started, there may be no accurate instance of data in the memory device that corresponds to the data being programmed. Using the buffers provided by the teachings above, an "extra" copy of program data may be retained, permitting read requests for that data to be intercepted and filled directly from the buffer in which the data is temporarily retained.

As mentioned above, in an embodiment featuring buffers and separated control of communications for a IO side of the device (i.e., between the IO interface and the buffers, and associated register control) and a memory array side of the device (i.e., between the memory storage space and the buffers), concurrent operations may be generally performed independently for each side, in a manner that will be further discussed below.

It is emphasized the methods and structures discussed above (e.g., for multiple "N" buffers) are exemplary only; there are embodiments discussed above that utilize, for example, only one or two buffers. The exemplary methods discussed above may be suitably adapted for use with these or other structural embodiments.

A. IO Side Control.

As mentioned, communications between the IO interface and an array of buffers may be controlled independently of memory array control functions, and may be effectuated by a memory controller or by on-board control logic within the device. Generally speaking, functions associated with this IO control logic include monitoring buffer availability, loading buffers with data from the external bus, updating a status register used for buffer control, fractioning an erase, program or read command into a number of constituent steps and queuing of those steps for the appropriate control logic, notifying a controller (if required for an embodiment) that read data is ready, or otherwise feeding read data out onto a bus for upstream transmission. These functions are illustrated in FIG. 5, which illustrates a method 501 for IO control logic.

As seen in FIG. 5, the method begins when a new memory operation is received, as indicated by a process start block 503; this box is labeled with the acronym "R/Pg(w/e)" to indicate that the operation may include a read command for a particular address or a state change operation, such as a write or erase command. Initially, it must be determined whether the memory device has capacity to initiate the transaction, as represented by a decision block 505. If there is at least one buffer available, the memory device may immediately receive the command and, if supported by the embodiment, it may still be possible for the device to receive and queue commands if immediate buffer assignment is not required. For example, if the implementation is such that the memory device performs dynamic buffer assignment, the memory device can be designed to receive and queue any number of read commands and associated memory addresses (up to cache limits) and can simply assign a buffer as it has bandwidth to support a new read operation. For state change operations, it may be desired (again if the device is charged with buffer assignment) for the device to raise an error flag (as indicated by process termination block 507) if no buffers are instantaneously available to process a desired operation. For example, if the implementation features only three memory buffers, one of which is used to retain a copy of a page being written to memory, and two of which are already in use in connection with reads of different pages, the memory device may be configured to toggle a logic level of an error detection pin, which would inform the controller that it should queue the additional transaction until memory is ready to process it. Alternatively, the memory device may be configured simply to set an internal free/busy status register flag, which the controller could be caused to read prior to commanding any new operation. Also, in an embodiment where the controller commands individual steps within the memory device, the controller would itself track buffer allocation and, so, would "know" when a new memory operation could be initiated.

1. Handling Of New Transaction Requests.

Per numeral 509, the method 501 then proceeds to determine whether a requested operation is a programming operation or a read command—read requests may be, depending on implementation, queued for processing without immediate buffer assignment. A programming request will typically counsel immediate buffer assignment and loading of data from an external bus. For example, the controller may begin transmitting a new page of data to be programmed into memory with, or immediately subsequent to a program command, and so, a buffer may need to be quickly assigned in order for the device to receive this data. For read operations, the method 501 may add the read request and associated memory address to a read request stack to be processed on a first-in, first-out basis, and the method may then terminate (as indicated by reference numerals 511 and 513). [Notably, in at least one embodiment discussed below, where read steps and state change steps are interleaved, it may be desired to use the IO control logic to immediately assign a buffer to new read requests (i.e., upon receipt from a controller), to avoid data synchronization issues if a program request closely follows a read request to the same page.] If the operation is a programming operation, the method may perform steps of assigning a buffer, transferring program data into the assigned buffer, updating of a status register, and adding (once the buffer is loaded) suitable commands into a program operation stack, all as represented by reference numeral 515.

FIG. 5 shows an exemplary status register (or state machine) 517 controlled in connection with buffer assignment. The register has a number of fields, including (1) an identity field for each buffer (labeled "B1," "B2," and "B3, respectively, with a continuation arrow to indicate that more buffers may be provided for if desired), (2) a set of flags ("FI") to indicate whether the particular register is (a) free or in-use for a transaction, or (b) busy being loaded or is stable, (3) an address of memory storage space to be associated with buffer contents and (4) for implementations where that support multiple masters, an identity associated with the particular master. With new commands processed and buffers assigned in the manner indicated above, the process may terminate until a new command is received from an external device (e.g., a memory controller), as indicated by numeral 519. In some embodiments, this status register or state machine may be stored resident in each memory device, while in other embodiments, a flash controller (e.g., such as the controller 303 from FIG. 3) may maintain a status register for each memory device. In this event, individual commands issued from a controller would include a buffer identity or opcode field, as also represented by the buffer identity associated with reference numeral 517.

2. Dynamic Buffer Assignment And Buffer Tracking.

One advantage of some of the structures discussed above is that a storage unit in the non-volatile memory may be effectively read notwithstanding that the unit (or data in the write data register) is in a state of transition. This may be effectively accomplished by leaving a copy of data (program data) in a buffer after that data is copied to the write data register, and using the status register (as discussed in connection with FIG. 5 above, for example) as a reference for incoming memory reads. Such an operation is illustrated for example in FIG. 6, which presents a control method 601 for reading data that is in the midst of being programmed.

Figure 6:
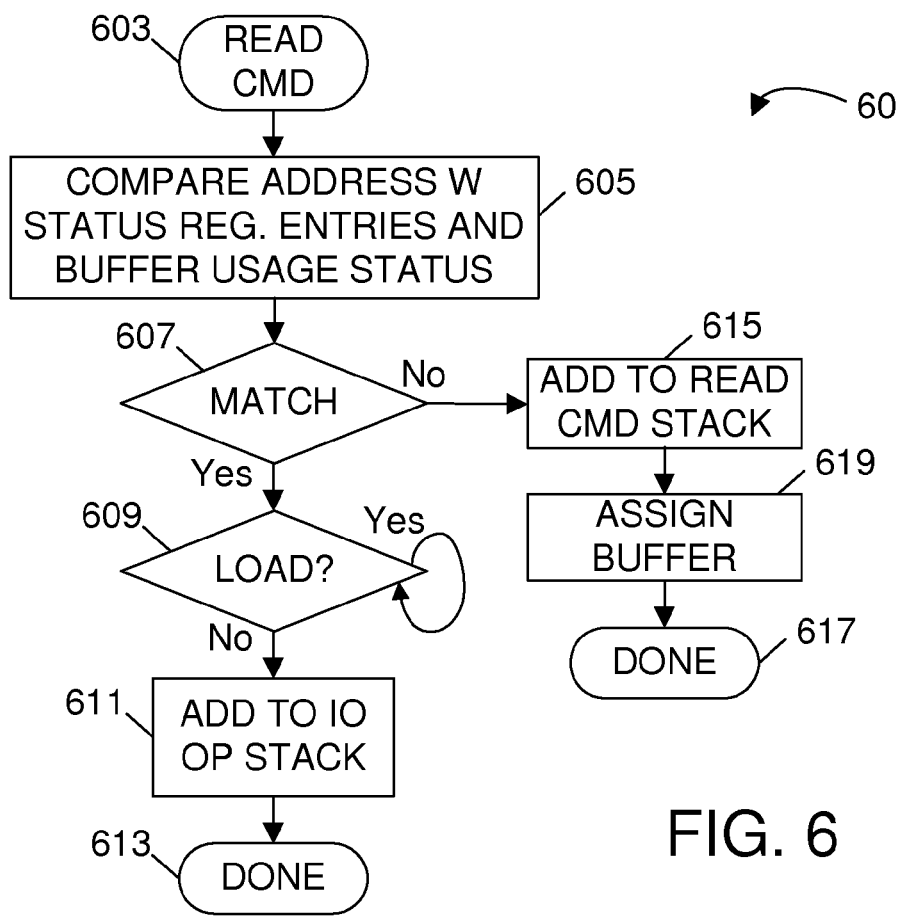
FIG. 6 is a flowchart that shows a method 601 of managing read requests as they are received from a controller. The method 601 may be implemented by IO control logic that manages communication flow primarily on "one side" of buffers, between the buffers and an external data bus.

In particular, as indicated by numerals 603 and 605 in FIG. 6, when the IO control logic detects an inbound read request, it compares the address represented by the request with the contents of the status register entry (e.g., the register 517 of FIG. 5). Logic can effectively compare entries for buffers in the order of most recently assigned buffer, and can stop with the first match (to ensure that it does not treat a prior erase request as a cache for reads to the associated memory space). Other options also exist. If the read address matches the entry for any buffer, the match indicates that a copy of the data sought may already be stored in one of the buffers, and the flags of the associated entry in the status register are then examined to ensure that the associated data is not still currently being loaded into the buffer (i.e., that the data as represented in the buffer is accurate). Facilitating this functionality is one reason why a designer might wish to immediately assign a buffer for a new transaction instead of postponing buffer assignment to be contemporaneous with sensing of page contents from memory (as was alluded to above in connection with FIG. 5). That is to say, immediate buffer assignment upon receipt of a controller request ensures that a subsequent read for the same page (instead of queuing a command with deferred buffer assignment) will necessarily trigger a match using the method of FIG. 6. If data is still being loaded into the buffer, the IO control logic may wait until the loading is finished but, once data loading is complete, the controller can be alerted that data is ready to be read. As indicated earlier, there are a number of mechanisms that may be used to perform this alert, including toggling a "free/busy" pin, setting a status register that is periodically checked by the controller, sending a command to the controller, or some other mechanism. Once the controller has been alerted, the controller and the memory device can trigger transfer of the data out of the buffer and onto the external bus using, for example, another controller-issued read command (or by different commands, e.g., triggering first a load of data into a buffer, followed by a read command directed to the buffer in question). These functions are variously represented by numerals 607, 609, 611, and 613 in FIG. 6. Should no "hit" be found within the buffers, the IO control logic determines that the requested memory page is not to be found in a local buffer, and it adds the command in question (and associated storage unit address) into a read stack for the memory array control logic as indicated by numeral 615 of FIG. 6. The method may then be terminated, as indicated by numeral 617. As just commented on, it may in connection with commanding this operation be desired to immediately assign an open buffer to a new read command (such that any subsequent read for the same page will trigger a "hit" in the local buffers and so be directed to read a copy of that buffer); this method of facilitating cache preparation, denoted by numeral 619, can be expected to be both faster than a read to the storage array and potentially more accurate, i.e., as the associated storage unit may be in the midst of loading when a subsequent memory request is received.

As these examples indicate, it may be important in some implementations to track buffer usage providing, for example, indicators of whether each buffer is free or in-use, and whether each buffer is also in the process of being loaded. Effectively, status flags in a register may be used to indicate the following buffer states:

(a) buffer unused and may be dynamically assigned to a new transaction;

(b) buffer is in use and is currently stable, i.e., is not busy being loaded; whether or not a programming operation (i.e., write or erase) is ongoing, current contents associated with the particular memory address may be read directly from the buffer by the 10 control logic without even involving the memory array control logic or the memory storage space; and (c) buffer is in use and is currently being loaded; in this state, buffer contents may be inaccurate (e.g., partially valid, partially invalid data) and thus a memory operation (whether controlled as a step or command managed by the memory array control logic or an IO operation managed by the IO control logic should be queued and effectively "wait" until the associated flag is changed to indicate that loading is complete.

By coupling this status data (e.g., the data represented by register flags) with buffer identification and the page address corresponding to buffer contents, most memory operations contemplated by this disclosure may be performed. For example, parallel operation processing may be effected during a programming operation by serving data directly from the buffers, essentially using these buffers as a form of local cache within the memory device.

3. Signaling Completion And Freeing Buffer Resources.

Certain steps performed by the IO control logic as well as the memory array control logic can be used to release a buffer for new uses as each memory operation is completed. For embodiments that support retaining a copy of program data in a buffer, so that that data can be read even while a multiple cycle program command is ongoing, an associated buffer can be released once the programming is verified as completely accurate (e.g., comparison between the write data register and the storage unit undergoing programming indicate that nothing remains to be programmed). To perform this release, the memory array control logic may simply change a register status bit (e.g., the first "FI" field for the pertinent buffer) to indicate that the IO control logic may now apply the buffer in question to a new transaction (i.e., because the data just programmed may now be reliably obtained from the memory storage space). With respect to IO control logic, buffers can similarly be recycled once a read operation is complete (e.g., by a controller, in implementations where the controller must pull read data, or by the IO control logic in implementations where the memory must affirmatively transfer the data). Conversely, the buffer may also be used to indefinitely hold data if a programming operation does not complete correctly; for example, if a predetermined number of programming cycles (e.g., 20) do not "reset" or program a specific unit (e.g., page or block) correctly, an error signal can be raised to the controller, and the buffer holding the data can be used as temporary storage until the controller marks the storage unit in question as "bad" and reassigns the data to other memory space (either in the same device or a different non-volatile memory device).

Again, as was alluded to above, as each new memory request is received, the memory device can poll its status registers to select and assign the first available buffer. By changing buffer status to "free" as soon as corresponding request is fulfilled, the control logic helps ensure that the device can immediately reapply freed buffers and accept new memory requests as soon as presented.

The description just provided as to the tracking of buffer usage and dynamic assignment is exemplary only and, as will be apparent to one having skill in digital design, there are other ways these functions can be managed in either a memory device or in a controller (or other master).

4. Controller Versus Device Management Of Functions.

As mentioned above, the most straightforward way to implement and control the structures introduced by this disclosure will be to have the controller manage each individual step and operation within the non-volatile memory device(s), for example, the moving of data into and out of each buffer, and the operations involved in each individual state change cycle. The reason for the straightforward nature of this design is that management functions described above may, in a controller-managed environment, be implemented relatively easily via controller instructional logic, and the support for simplified commands is relatively "cheap" in terms of required device hardware and is straightforward to implement. As indicated above, a status register or state machine describing buffer usage and contents may be retained in the controller for each memory device; this structure if use renders it relatively easy for the controller, for example, to build commands associated with moving data into and out of each buffer, and of course, to monitor status. For example, a controller designed according to these principles may rely upon command generation logic to generate commands to:

transfer data from a sense amplifier unit to a specific buffer;
transfer data from a specific buffer to the system data bus;
write program data into a specific buffer;
read data that is the subject of a program command from a specific buffer;
copy data from a specific buffer into a write data register; or
non-destructively copy data from a specific buffer into the write data register.

Commands generated by the controller would in this event, as appropriate, generally specify a specific target buffer using an op-code as alluded to above. Other commands are of course possible, as will occur to those having skill in digital systems design.

There are also, however, motivations for a designer to include some of or most of the management functionality in a non-volatile memory device. For one, memory devices which implement the management logic and structures called for above may be designed to be compatible with existing memory controllers and operating systems. Memory devices designed in this manner may also be relatively easily adapted to a multiple master environment (e.g., as a component in a network or system that has multiple microprocessors); as a corollary, in this event, individual commands issued by a controller or other "master" may include a master identification field, or opcode, as further represented by numeral 517 in FIG. 5. Further, each controller will generally have a number of tasks that it is called upon to manage and, for at least some applications and to the extent that functions can be offloaded to each memory device without impacting overall speed, overall system efficiency can be improved.

B. Memory Array Control Logic.

The memory array control logic is called upon to manage the flow of information between a set of buffers and the memory storage space, including the filling the write data register with data used to program memory pages, the transferring of verification data from the sense array (the sense amplifier unit) to the write data cache, and the moving of read data from the sense array to an assigned buffer. As mentioned above, data associated with a programming operation may be retained in a buffer, and data for a subsequent program operation may be stored in another buffer and queued until earlier multiple cycle state change operations are completed; as a new page of memory is to be operated upon, the memory array control logic functions transfer data from the pertinent buffer into the write data register.

It was mentioned above in connection with inbound memory commands that the memory array control logic may be designed to effectively queue program and read operations in two different stacks, separating control of state change operation steps and read operation steps. This differentiation, as will be seen below, represents one possible way of structuring device operations so that reads and state change operations may be automatically interleaved without significant impact on memory operations.

1. Processing Command Stacks And Updating Status Registers.

Figure 7:
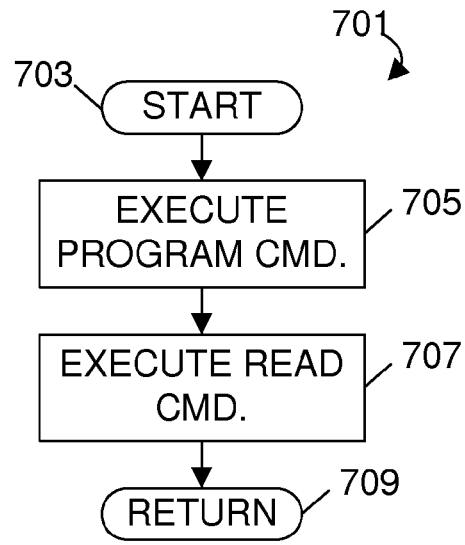
FIG. 7 is a flowchart of a method 701 that shows general memory array management tasks associated with memory array control logic (i.e., that may be used to manage communication flow on the "other side" of the buffers, between the buffers and the memory array). As will be explained below (and as was the case with the functions of FIG. 6), these functions may be managed either by a memory controller or by hardware or instructional logic resident on each memory device.

FIG. 7 presents a logic flow diagram that illustrates a method 701 by which state change and read operations may be interleaved. As mentioned just above, read and state change steps may be separated into separate functional stacks or queues. The memory array control logic function operates in a wait mode while no unexecuted memory operations are required by either queue. When a step is presented by either queue, the method 701 proceeds to execute a state change step, first, followed by a read step, second, as indicated by functional references 703, 705, 707 and 709. Following this order of execution, the method returns to the starting block 703 and again operates in the same cycle, i.e., executing any queued state change step followed by any queued read operation step, to the extent that each are represented in the respective queues.

The execution of each step may result in the effective insertion of additional steps in each functional queue, as well as the update of the status register for each affected buffer. For example, as previously mentioned, once a state change operation is finished (e.g., a storage unit is correctly programmed), the associated buffer may be released because complete, valid data may be read from non-volatile memory and the buffer is no longer needed. Put another way, each step may represent a single "cycle" of a multiple cycle state change operation (i.e., program or erase) or, in the case of reads, a transfer of a single memory page to a buffer. As part of the verify phase of the each program-verify cycle, if it is determined that data has correctly changed state, the operation can terminate and the buffer can be released. If a further cycle is required, after updating the write data register, the verify phase can insert a new command (i.e., a new cycle), effectively at the top of the programming queue. Thus, after executing a read operation (if present) by transferring a page of memory to a buffer, the method 701 of FIG. 7 is effectively looped back to perform another cycle. In this manner, state change and read steps (if present concurrently) may be automatically interleaved, with a read (or several read operations if desired) occurring between each cycle of a multiple cycle state change operation.

2. State Change Operations.

Figure 8:
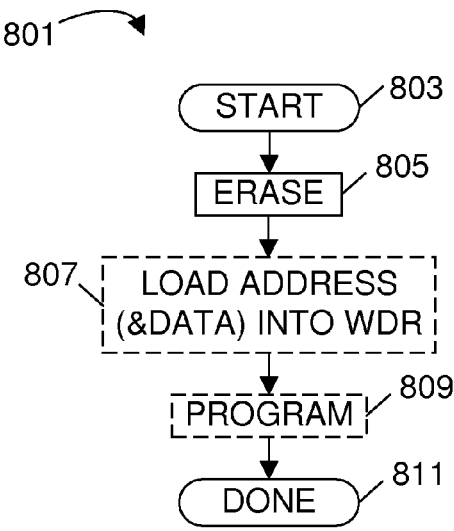
FIG. 8 is a flowchart of a method 801 associated with programming tasks (i.e., tasks that involve write circuitry for the memory array). As indicated by FIG. 8, data may be copied from an assigned buffer into a write data register ("WDR"), permitting the data to be retained in the assigned buffer and read during state change operations, notwithstanding that write data register ("WDR") contents (and contents of the pertinent memory space within the array) are themselves in transition during programming.

FIG. 8 provides a method 801 used to represent this logic flow just described, focusing on steps associated with a programming operation. When a new program (or write) request is received from the controller, the IO control logic queues a series of programming steps that are to program a specific memory address (e.g., a block or a page of memory, for example). As indicated by numeral 803 in the case where either a particular memory page is to be written, an erase of the unit in question typically first occurs, corresponding to a reset of a block of data used to free up memory cells. An erase operation is performed (as indicated by numeral 803) for as many cycles as needed to ensure the "reset" of all memory cells associated with the block in question. As indicated by numeral 805, the programming operation may then occur, beginning with the transfer of associated data from a buffer to the write circuitry (807) and programming the data into the storage unit (e.g. the page of memory) using multiple cycles, as also indicated by function block 809. Thus, each cycle of a multiple cycle programming operation may be viewed as a single process or step (which completes per numeral 811). As mentioned, the entire multiple step process may be managed so as to have any pending reads inserted in between erase cycles, in interleaved fashion.

Figure 9:
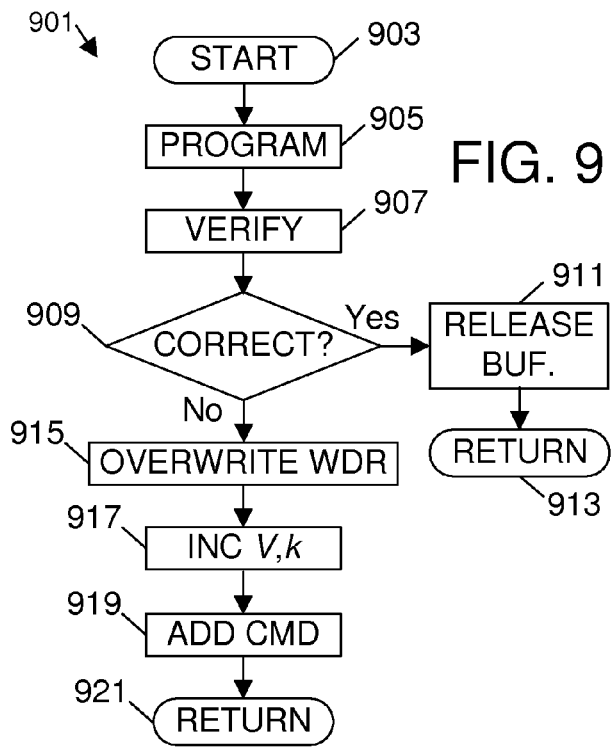
FIG. 9 is a flowchart of a method 901 associated with each program-verify cycle of a program or erase command. The cycles are repeated as necessary until (1) the associated space in memory has correctly changed state (in which case the assigned buffer used to cache program data is released) or (2) a maximum number of cycles is reached (represented as a cap upon the variable "k" seen in FIG. 9).

FIG. 9 provides a detailed flowchart of operations associated with each cycle of a state change operation. FIG. 9 depicts a method 901 that effectively begins when the program stack logic signals a pending program operation for a specific page, with an address fed to the write circuitry and associated data (i.e., specific data in the case of a program operation), as collectively represented by numeral 903 in FIG. 9. The method then invokes a program phase, identified by numeral 905, during which the write circuitry charges the memory storage space as necessary and attempts to program each memory cell corresponding to a page value that is a "zero" (i.e., this value is used to turn "on" the control gate associated with an affected memory cell). The first such program operation will use a default voltage value that is set by the write circuitry and represents a minimum programming voltage. Notably, while the operation is similar for program and erase operations, the particular way in which a cell is programmed may differ if the cell is to be set (i.e., "programmed") or reset (i.e., "erased"). For flash memory for example, an erase may be applied for a block, depending on design, by charging a substrate to essentially remove any quantum tunneling effects created in the substrate, whereas a "set" typically may be effected by applying turning on a transistor, to thereby apply voltage to a control gate that will charge an associated floating gate for a memory cell. For other types of memory (e.g., RRAM), "set" and "reset" operations may involve different voltages. [The particular way in which charges are scaled and routed is defined by the write circuitry in dependence upon settings established when data is initially transferred from the buffers to the write circuitry and the write data register.] For erase operations, proper erasure may be performed by detecting whether any memory cell in a block has not been correctly reset. If any cell is not correctly reset then the erase may be applied again, i.e., using what are essentially PV cycles to repeat the operation until all bits have been reset to a logic "1." For program operations, the method then invokes a verify phase, which performs an exclusive-OR between the storage unit (i.e., the memory space being programmed) and the write data register and inverts the results. If there are no "zeros" represented in these results, then the page has been correctly programmed (or erased) and the programming operation may be terminated, with any associated buffer being released—these operations are collectively represented by numerals 907, 909, 911 and 913 in FIG. 9. Alternatively, if there is at least one "zero" in the results, the complete results are used to overwrite the write data register; the write data register will then have a "zero" for each memory page location (i.e., for each cell in the storage space) where prior state change attempts were unsuccessful, and the particular cycle (program and verify phases) is completed. As another cycle will need to be performed, the step ends with increasing "V" (i.e., by increasing the default voltage used by the write circuitry, such that the next state change attempt will use a higher voltage) and by adding another state change operation for the same memory page to the top of the processing queue. The operation also increases a value "k," representing the number of iterative PV cycles already performed for the storage unit in question; this value, as alluded to earlier, is used to detect a "bad" memory block, i.e., should some predetermined limit (such as "20 cycles") be reached, the memory device may in this case signal an error to the controller and await further instruction for the data in question. These functions are generally represented by numerals 915, 917, 919 and 921 in FIG. 9.

3. Read Operations.

Figure 10:
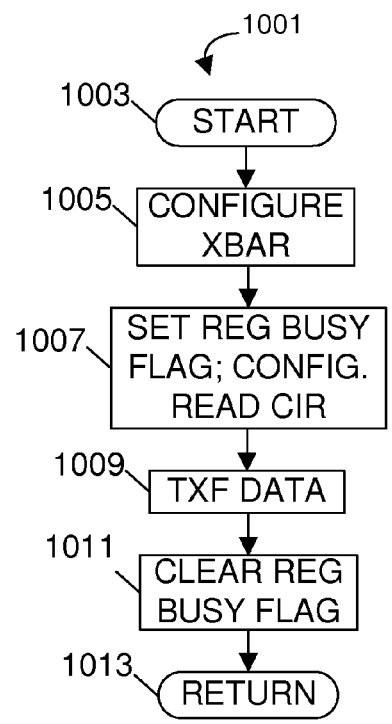
FIG. 10 is a flowchart of a method 1001 used by the memory array control logic to process a read operation (i.e., the step of reading a page of data from the memory array and transferring that data to the buffers). As indicated by FIG. 10, the method includes configuring the crossbar to route data from a sense amplifier unit to an assigned buffer, and changing buffer status register flags so that the data is not read out of the buffer while in the process of being loaded.

FIG. 10 illustrates one method 1001 by which a read operation may be accomplished in association with the methods, structures and logic discussed above. In particular, each read may begin with a configuration of the crossbar (if an embodiment that relies on a crossbar is used, e.g., such as the embodiment seen in FIGS. 2 and 3). Represented by numerals 1003 and 1005, this configuration function serves to route data from the sense amplifier unit to an assigned buffer that will serve as a temporary destination for page contents. Following crossbar configuration, the buffer status flag for an assigned buffer may changed to indicate that the assigned buffer is "busy" and that if read at this time, its data may be in a state of transition and may not be accurate. Circuitry associated with the storage space is also provided with address data for the particular unit (e.g., the particular page of data) that is to be read, and read data is then transferred to the assigned buffer, as indicated by numerals 1007 and 1009. When the read is complete, the status register is again accessed (per numeral 1011) in order to again change the buffer status flag to indicate that the buffer is no longer "busy" (i.e., that it is no longer loading data and consequently that its contents represent a valid page of data). The method then terminates, as indicated by numeral 1013.

Read operations are generally simpler than the state change operations described earlier. While these operations may also involve multiple steps, the charging and voltage applications that occur for sensing operations are typically different than for state change operations just described. Generally, because of the need to switch different particular voltages onto potentially different signal paths for read, program and erase operations, it generally is preferred to complete each cycle (e.g., each write or erase cycle, or each read of an entire page) prior to interleaving another command "within" a read operation, so as to not change memory array control settings but, again, there may be counterveiling motivations dependent upon the desired application.

With various frameworks and design options for implementing memory structures thus described, this disclosure will now reiterate specific examples of operations that can be performed using the structures and methods described above.

III. Examples of Specific Transactions

1. Pipelining Multiple Read Requests To The Same Memory Storage Space.

As mentioned earlier, the structures proposed by this disclosure facilitate faster non-volatile memory operation, because multiple operations can be sent to a memory device and commenced at least in part, without requiring completion of a prior operation. This concurrency can be applied to the same memory space, that is, to enable concurrent access by multiple memory operations to the cells served in common by a single write data register (or parallel group of such registers) and by a single sense array.

One concurrent operation that can be performed involves the processing of multiple read requests. As indicated, the IO control logic may stack multiple operations without awaiting completion of a first operation. In this regard, the program control logic may transfer data between the sense array (sense amplifier unit) and one buffer while the IO control logic transfers a second page of memory from a different buffer to an external data bus, for transmission to a controller. The use of a crossbar permits the program control logic to switchably-connect any buffer to the sense array, so that any buffer may be dynamically assigned as a temporary destination for read data. The filling of buffers associated with read requests may consequently be pipelined for quick execution. Multiple pages of memory may then be read out of a flash device in quick succession, without having to await the latency normally associated with per request activation and transfer of data from the sense array for each requested page of memory.

2. Pipelining Multiple Write/Erase Requests.

The structures described above also permit the pipelining of multiple write or erase requests in much the same manner as just described. The 10 control logic may initiate state change operations and assign buffers to write (program) requests, such that multiple pages of data to be written into nonvolatile memory can be loaded in quick succession into different buffers; while the memory device is busy with one state change operation, a page of data for a subsequent write operation can be queued up, notwithstanding the busy status of write circuitry and sense array associated with the memory space. That is to say, the memory devices introduced above generally do not need to wait for full completion of a state change operation (and associated representation of "busy" status to a controller), but can proceed to accept new state change requests for additional pages or blocks of memory even while a multiple cycle operation is ongoing.

3. Interleaving Read Requests Between Program/Erase Cycles Or Phases.

The operations just described may also be extended to simultaneous read operations and write (program) or erase operations. Specifically, while one page of memory is being programmed, instead of maintaining the device as "busy," one or more pages of memory can be read by streaming data (already loaded into data buffers) out over the external bus to a controller, notwithstanding that write circuitry and sense circuitry are "busy." Because these operations can take multiple cycles, the logic described above permits the interleave of read operations, such that a multiple cycle write or erase operation can be interrupted, to allow program control logic to quickly transfer a page of data into an assigned buffer and then resume state change operations, all without disturbing write circuitry settings or write data register contents. As the write circuitry then continues with its operation, the IO control logic then transfers that page of memory out over the external bus to satisfy a controller read request. In some embodiments, it may be possible to interrupt phases within a single state change cycle (i.e., to perform a read before the verify phase of a programming cycle); for standard flash array implementations, however, this design choice may be suboptimal due to the relative ease with which cell contents may be sensed as the cell is programmed. Extending the read and state change concurrency benefits, discussed above, multiple reads and multiple state change operations may be received by a memory device at the same time and pipelined (with individual steps interleaved) for efficient operation. The memory device, if designed appropriately, may be configured for use as a slave of a single master (e.g., a single controller) or for multiple devices (i.e., by providing structure to permit each memory device to identify the master requesting each read and notifying that master when requested data is ready). Any amount of concurrency can be supported, depending on the number of buffers designed into a given memory implementation.

IV. Conclusion

This disclosure has presented embodiments of a non-volatile device and related systems and methods of operation. More particularly, using a device that separates paths associated with loading a write data register, outputs read data from a sense amplifier unit, and feeds data from the sense amplifier unit to update the write data registers, one may in-parallel perform concurrent processing within the same memory organization (e.g., within the same memory bank). In some embodiments, multiple buffers may be each dynamically assigned to a memory page which is to be read or programmed, providing for parallel processing of transactions and permitting one to read data that is currently amidst a program operation. Other embodiments, applications and permutations of these structures and methods exist.

As should be apparent from the discussion above, these structures potentially enable a much more widespread usage of non-volatile devices; by reducing latency for these devices, the embodiments discussed above potentially permit these devices to be faster, making them a more practical choice for applications where speed is at issue. Because some applications may be constrained by power as well as program and access speed considerations, these teachings may enable applications previously thought impractical, e.g., by permitting faster non-volatile read, programming and erasing in portable and mobile devices.

In some designs, certain functions may be tracked by a memory system controller, such as a flash or other non-volatile controller. For example, the controller may be vested with responsibility for waiting for read data, or for "pinging" a status register and associated buffer to retrieve data corresponding to a queue read request. In other designs, some of these functions may be instead made resident in a memory device; for example, especially for embodiments where one memory device can interact with multiple processors, it may be desired to have the memory device dynamically assign specific buffers to specific transactions (e.g., a read operation) and inform the associated controller of the assigned buffer. In still other cases, the buffer assignment can be made transparent to the controller, with cross reference between individual memory requests and associated buffers being made purely within the memory device. Other variations of these principles may also occur to those having skill in the art.

Also, the structures presented above have focused on flash memory as one likely embodiment of these principles, but other applications also exist, i.e., the principles discussed herein may be applied to any form of memory where relatively long programming, write or erase lead time is required, or where these operations require multiple cycles and/or verification steps. Without limiting these principles, some specific memory forms (depending on specific design) to which these principles may be applied include resistive RAM, phase change RAM, magnetic RAM, and other forms of memory where a physical state is changed in order to store digital information.

The devices presented above also are described in at least partial terms of instructional logic, but it is also possible to design each of the functions referenced above so that operations are managed entirely, or almost entirely, by hardware (i.e., logic circuits) or entirely, or almost entirely, by instructional logic (i.e., software or firmware). In one embodiment, the instructional logic can be embodied as an apparatus comprising instructions stored on machine readable storage media, where the apparatus is adapted for use in the control of at least one nonvolatile memo device having multiple buffers that are each used to hold data during memory operations. The instructions when executed can cause a machine to track usage of each one of multi buffers resident within the nonvolatile memo device to identify, in connection with the first memory operation, a first one of the buffers as not currently being used, and to responsively load first data associated with at least a page of memory in the device into the first one of the buffers, to identify, in connection with the second memory operation, a second one of the buffers as not currently being used, and to responsively load second data associated with at least a page of memory in the device into the second one of the buffers and responsive to the tracking, to perform the identifying of the first one of the buffers and the identifying of the second one of the buffers on a dynamic basis, such that any one of the multiple buffers may be used for either the first memory operation or the second memory operation depending upon availability relative to prior transactions. In a more detailed embodiment, this apparatus can be adapted for use by a memory controller, where the instructions comprise firmware and the machine readable storage media is in the form of a read-only memory device.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

What is claimed is:

1. A memory device, comprising:
   a memory storage space having a plurality of storage units, each storage unit representing a minimum amount of storage space that must be programmed together;
   a write data register to hold data for use in programming of at least one of the storage units, in connection with a multiple cycle state change operation;
   a sense amplifier unit to read data from any of the storage units;
   an input/output (IO) interface; and
   internal routing to
   (i) couple the sense amplifier unit with the write data register, to feed back storage unit contents for use in the multiple cycle state change operation, and
   (ii) couple read data from one of the storage units to the IO interface, contemporaneous with the multiple cycle state change operation.

2. The memory device of claim 1, where:
   the device further comprises at least one data buffer operatively positioned (i) in between the sense amplifier unit and the IO interface and (ii) also in between the write data register and the IO interface; and
   the internal routing is adapted to route program data from the at least one buffer to the write data register and to route read data from the sense amplifier unit to the at least one buffer.

3. The memory device of claim 1, where:
   the memory device further comprises at least two buffers, operatively positioned in between the sense amplifier unit and the IO interface, each buffer sized to at least hold a memory page; and
   the internal routing includes a switching mechanism adapted to, while a multiple cycle state change operation is in progress, alternatively route data from the sense amplifier unit to (i) the write data register, for use in connection with the multiple cycle state change operation, and (ii) a dynamically assigned one of the buffers, to transfer the read data from the sense amplifier unit to the dynamically assigned one of the buffers contemporaneous with the multiple cycle state change operation.

4. The memory device of claim 3, where the multiple cycle state change operation includes a write operation, and the switching mechanism is to transfer the read data from the dynamically assigned one of the buffers to the output interface while a write operation is in progress.

5. The memory device of claim 3, where the internal routing is adapted to load a page corresponding to the program data into a second dynamically assigned buffer in association with a write operation, such that a storage unit of the memory storage space that is the subject of a write operation may be read contemporaneous with the write operation, notwithstanding any transitory state of the storage unit of the memory storage space that is the subject of the write operation, by reading data associated with the write operation from the second dynamically assigned buffer.

6. The memory device of claim 3, where the internal routing includes a crossbar having a width at least equal to the page size, the crossbar adapted to route data between (i) either of the write data register or the sense array, and (ii) any one of the at least two buffers.

7. The memory device of claim 6, where each one of the at least two buffers is externally addressable through the IO interface, such that an external device can selectively cause loading of data in any specific one of the at least two buffers.

8. The memory device of claim 3, where:
   plural cycles of the multiple cycle state change operation each include a verify operation that compares contents of a storage unit of the memory storage space with contents of the write data register; and
   the internal routing is configured to inhibit transfer of the read data to a dynamically assigned one of the buffers during a verify operation.

9. The memory device of claim 3, where:
   one of the buffers is adapted to store a copy of data originally stored in the write data register for reference during the state change operation, to permit reading of that data originally stored in the write data register contemporaneous with the multiple cycle state change operation; and the memory device is adapted to permit reading of data associated with any one of the plurality of storage units of the memory storage space contemporaneous with a state change operation, by reading requested data from one of the storage units that is not the subject of contemporaneous state change from the memory storage space, and by reading the data originally stored in the write data register from the one of the buffers.

10. The memory device of claim 3, where dynamic assignment is performed by assignment logic, resident on-board the memory device.

11. The memory device of claim 3, where the switching mechanism is adapted to transfer the read data from the sense amplifier unit to the dynamically assigned buffer while an erase operation is in progress.

12. The memory device of claim 1, where:
the memory device further comprises at least three buffers, each sized to at least hold a memory page;
the internal routing is configured to both (i) store a copy of the read data in dynamically assigned first one of buffers, and (ii) transfer the read data from the first one of the buffers to the IO interface while the multiple cycle state change operation is in progress;
the internal routing is further adapted to load program data into a dynamically assigned second one of the buffers, and to permit reading of the program data from the second one of the buffers, contemporaneous with the multiple cycle state change operation; and
the memory device is adapted to permit reading of data associated with any one of the plurality of storage units contemporaneous with the multiple cycle state change operation, by reading each unit not the subject of contemporaneous state change from the memory storage space, and by reading the program data from the one of the buffers.

13. The memory device of claim 12, where the state change operation includes a multiple cycle, program-verify operation.

14. The memory device of claim 12, where the internal routing is to (a) transfer data between sense amplifier unit and any one of the at least three buffers, and (b) transfer data between the sense amplifier unit and the write data register.

15. The memory device of claim 14, where the memory device further comprises control logic adapted to interleave a memory read operation in between cycles of the multiple cycle state change operation, the control logic adapted to queue the memory read operation during at least a verify phase of one of the cycles of the multiple cycle state change operation, and to perform the read operation in between cycles of the multiple cycle state change operation.

16. The memory device of claim 1, embodied as a flash memory device.

17. The memory device of claim 1, where the internal routing is adapted to, within a single program-verify cycle, (i) couple the sense amplifier unit with the write data register, to feed back storage unit contents for use in the multiple cycle state change operation, and also (ii) couple read data from one of the storage units to the IO interface.

18. A memory device, comprising:
a plurality of storage units of storage area;
a sense mechanism to read data values from any of the storage units;
a write data register to be used in programming data values into any of the storage units;
a plurality of buffers;
a crossbar coupling (i) each of the plurality of buffers with (ii) a selective one of either the write data register or the sense mechanism; and
an input/output (IO) interface adapted to operatively couple each of the plurality of buffers with an external bus.

19. The memory device of claim 18, embodied as a flash memory device.

20. The memory device of claim 18, where each storage unit represents at least one of (i) the minimum amount of memory space that can be separately programmed or (ii) the minimum amount of memory space that can be separately erased.

21. The memory device of claim 18, where:
the device is adapted to program individual ones of the storage units by a multiple cycle, program-verify operation; and
the device further comprises means for permitting the read of specific data contemporaneous with an uncompleted multiple cycle, program-verify operation of the specific data.

22. The memory device of claim 18, where:
the device is adapted to program individual ones of the storage units by a multiple cycle, program-verify operation; and
the device further comprises control logic adapted to interleave a read operation between cycles associated with the program-verify operation.

23. The memory device of claim 18, where:
the device is adapted to program individual ones of the storage units by a multiple cycle, erase operation; and
the device further comprises control logic adapted to interleave a read operation between cycles associated with the erase operation.

24. The memory device of claim 18, where the device is adapted to permit read of data for one of the plurality of storage units of the storage area from a first one of the plurality of buffers via the IO interface, and to simultaneously transfer data associated with a subsequent read operation of one of the storage units via the crossbar to a second one of the plurality of buffers.

25. The memory device of claim 18, where the device further comprises control logic adapted to (i) permit programming of first data into one of the plurality of storage units of the storage area using the write data register, (ii) queue second data associated with a subsequent programming operation of one of the plurality of storage units in one of the plurality of buffers, and (iii), following completion of the programming of the first data, transfer the second data via the crossbar from the one of the plurality of buffers to the write data register.

26. The memory device according to claim 25, where the device is further adapted to permit read of the first data from a second one of the plurality of buffers, and adapted to permit read of the second data from the first one of the plurality of buffers, each notwithstanding contemporaneous performance by the memory device of programming of one of the plurality of storage units of the storage area.

27. A memory device, comprising:
a memory array;
means for tracking usage of each one of multiple buffers within the device;
means for, in connection with a first memory operation directed to the memory array, identifying a first one of the buffers as not currently being used, and for responsively loading first data associated with at least a page of the memory array into the first one of the buffers;

means for, in connection with a second memory operation directed to the memory array, identifying a second one of the buffers as not currently being used, and for responsively loading second data associated with at least a page of the memory array into the second one of the buffers;

means for concurrently performing the first memory operation and the loading of the second data; and means for, responsive to the tracking, performing the identifying of the first one of the buffers and the identifying of the second one of the buffers on a dynamic basis, such that any one of the multiple buffers may be used for either the first memory operation or the second memory operation depending upon availability relative to prior transactions.

28. A method of operating a memory array, comprising:

tracking usage of each one of multiple buffers within the memory array;

in connection with a first memory operation directed to the memory array, identifying a first one of the buffers as not currently being used and responsively loading first data associated with at least a page of the memory array into the first one of the buffers;

in connection with a second memory operation directed to the memory array, identifying a second one of the buffers as not currently being used and responsively loading second data associated with at least a page of the memory array into the second one of the buffers;

concurrently performing the first memory operation and the loading of the second data; and responsive to the tracking, performing the identifying of the first one of the buffers and the identifying of the second one of the buffers on a dynamic basis, such that any one of the multiple buffers may be used for either the first memory operation or the second memory operation depending upon availability relative to prior transactions.

29. The method of claim 28, where tracking includes tracking each one of the multiple buffers in a flash memory controller.

30. The method of claim 28, where the first memory operation includes a multiple cycle program-verify operation.

31. The method of claim 30, where each cycle of the multiple cycle program-verify operation includes a program phase and a verify phase, and where concurrently performing includes loading the second data during the program phase and inhibiting loading of the second data during the verify phase.

32. The method of claim 28, where each of the first memory operation includes a read operation.

33. The method of claim 28, wherein each of the first memory operation and the second memory operation include a programming operation, the method further comprising loading a write data register with a copy of the first data from the first one of the buffers, programming the first data, and following completion of programming the first data, loading the write data register with a copy of the second data from the second one of the buffers.

34. An apparatus comprising instructions stored on non-transitory machine readable storage media, the apparatus being adapted for use in the control of at least one memory device having multiple buffers that are each used to hold data during memory operations directed to a memory array, the at least one memory device adapted to concurrently perform each of a first memory operation directed to the memory array and a second memory operation directed to the memory array using different ones of the multiple buffers, the instructions when executed adapted to cause a machine to:

track usage of each one of multiple buffers resident within the memory device;

identify, in connection with the first memory operation, a first one of the buffers as not currently being used, and to responsively load first data associated with at least a page of memory in the device into the first one of the buffers;

identify, in connection with the second memory operation, a second one of the buffers as not currently being used, and to responsively load second data associated with at least a page of memory in the device into the second one of the buffers; and responsive to the tracking, perform the identifying of the first one of the buffers and the identifying of the second one of the buffers on a dynamic basis, such that any one of the multiple buffers may be used for either the first memory operation or the second memory operation depending upon availability relative to prior transactions.

35. The apparatus of claim 34, adapted for use by a memory controller, the instructions comprising firmware and the machine readable storage media comprising a read-only memory device.

36. An apparatus for use with a memory array serviced by a plurality of buffers, each buffer coupled to an interface with a system data bus, the apparatus comprising:

a state machine to track utilization of each one of the plurality of buffers; and a controller-resident command generator, the command generator coupled to the state machine, the command generator to generate buffer-specific commands in response to state machine contents.

37. The apparatus of claim 36, wherein the state machine is resident with the memory array and the plurality of buffers in a memory device.

38. The apparatus of claim 36, wherein the state machine is controller-resident.

39. The apparatus of claim 36, wherein the buffer-specific commands include at least one of:

a command to transfer data from a sense amplifier unit to a specific buffer;

a command to transfer data from a specific buffer to the system data bus;

a command to write program data into a specific buffer;

a command to read data that is the subject of a program command from a specific buffer;

a command to copy data from a specific buffer into a write data register; or a command to non-destructively copy data from a specific buffer into the write data register.

40. The apparatus of claim 36, wherein the buffer specific commands include a buffer address field.

41. A memory device, comprising:

a memory array having a plurality of storage units, each storage unit representing a minimum amount of storage space that must be programmed together;

a write data register to hold data for use in programming of at least one of the storage units, in connection with a multiple cycle state change operation, where the data in the write data register is changed during the multiple cycle state change operation;

a buffer to hold a copy of the data loaded into the write data register, and in which the data is not changed during the multiple cycle state change operation; and control logic to serve a read request for the data undergoing programming in the at least one of the storage units from the buffer during the multiple cycle state change operation.

42. The memory device of claim 41, further comprising a state machine that identifies a storage location, including the buffer or the memory storage space, holding a true copy of said data.

43. The memory device of claim 42, further comprising plural buffers, where the control logic assigns each one of the plural buffers on an ad hoc basis for both use in loading a copy of write data into the write data register and in serving a copy of said data in connection with a read request directed to said data during the multiple cycle state change operation.

* * * * *